(12) United States Patent
Zhang et al.

(10) Patent No.: US 10,873,024 B2
(45) Date of Patent: Dec. 22, 2020

(54) PROVIDING THERMAL SHIELD TO RRAM CELLS

(71) Applicant: TETRAMEM INC., Newark, CA (US)

(72) Inventors: Minxian Zhang, Newark, CA (US); Ning Ge, Newark, CA (US)

(*) Notice: Subject to any disclaimer, the term of this patent is extended or adjusted under 35 U.S.C. 154(b) by 0 days.

(21) Appl. No.: 16/392,500

(22) Filed: Apr. 23, 2019

(65) Prior Publication Data

US 2020/0343447 A1    Oct. 29, 2020

(51) Int. Cl.
*H01L 45/00*    (2006.01)
*H01L 27/24*    (2006.01)

(52) U.S. Cl.
CPC ...... *H01L 45/1293* (2013.01); *H01L 27/2463* (2013.01); *H01L 45/08* (2013.01); *H01L 45/1233* (2013.01); *H01L 45/146* (2013.01); *H01L 45/16* (2013.01)

(58) Field of Classification Search
CPC ... H01L 45/1293; H01L 45/146; H01L 45/16; H01L 45/1233
See application file for complete search history.

(56) References Cited

U.S. PATENT DOCUMENTS

| | | | |
|---|---|---|---|
| 2017/0213821 A1* | 7/2017 | Or-Bach | H01L 21/6835 |
| 2018/0018263 A1* | 1/2018 | Cho | G06F 12/0802 |
| 2018/0175109 A1* | 6/2018 | Choi | G11C 13/0004 |
| 2019/0172826 A1* | 6/2019 | Or-Bach | H01L 27/0688 |
| 2019/0189691 A1* | 6/2019 | Lee | H01L 27/224 |

* cited by examiner

*Primary Examiner* — Douglas M Menz

(57) ABSTRACT

The technology of a crossbar array circuit and method of improving thermal shielding are disclosed. An example apparatus includes a bottom wire; a first vertical thermal shielding layer formed on the bottom wire, a bottom electrode formed on the first vertical thermal shielding layer; a filament forming layer formed on the bottom electrode; a top electrode formed on the filament forming layer; a second vertical thermal shielding layer formed on the top electrode; a top wire formed on the second vertical thermal shielding layer, wherein the filament forming layer is configured to form a filament within the filament forming layer when applying a switching voltage upon the filament forming layer, and wherein a material of the first vertical thermal shielding layer and the second vertical thermal shielding layer includes $ReO_x$, $RuO_x$, $IrO_x$, ITO, a combination thereof, or an alloy or doping thereof (with or without other thermally conductive materials).

15 Claims, 5 Drawing Sheets

| Materials | Thermal Conductivity, W/m-k | Electrical Conductivity, S/m |
|---|---|---|
| SiO2 | 1.4 | 1E-15 |
| Si3N4 | 30 | 1E-13 |
| Al2O3 | 18 | 1E-12 |
| W | 174 | 1.9E7 |
| Cu | 401 | 6.0E7 |
| Al | 205 | 3.5E7 |
| ReO3 | 48 | 5.2E6 |
| RuO2 | 19 | 2.5E6 |
| IrO2 | ~10 | ~1E6 |
| ITO | ~10 | ~1E6 |

PROVIDING THERMAL SHIELD TO RRAM CELLS

TECHNICAL FIELD

The present disclosure generally related to crossbar array circuits with Resistive Random-Access Memory (RRAM) and more specifically to providing thermal shield to RRAM cells.

BACKGROUND

Traditionally, a crossbar array circuit may include horizontal metal wire rows and vertical metal wire columns (or other electrodes) intersecting with each other, with crossbar devices formed at the intersecting points. A crossbar array may be used in non-volatile solid-state memory, signal processing, control systems, high-speed image processing systems, neural network systems, and so on.

A RRAM is a two-terminal passive device capable of changing resistance responsive to sufficient electrical stimulations, which have attracted significant attention for high-performance non-volatile memory applications. The resistance of a RRAM may be electrically switched between two states: a High-Resistance State (HRS) and a Low-Resistance State (LRS). The switching event from a HRS to a LRS is often referred to as a "Set" or "On" switch; the switching systems from a LRS to a HRS is often referred to as a "Reset" or "Off" switching process.

SUMMARY

Technologies relating to providing thermal shield to RRAM cells in crossbar circuits are disclosed.

In some implementations, an apparatus includes: a bottom wire; a first vertical thermal shielding layer formed on the bottom wire, a bottom electrode formed on the first vertical thermal shielding layer; a filament forming layer formed on the bottom electrode; a top electrode formed on the filament forming layer; a second vertical thermal shielding layer formed on the top electrode; a top wire formed on the second vertical thermal shielding layer, wherein the filament forming layer is configured to form a filament within the filament forming layer when applying a switching voltage upon the filament forming layer, and wherein a material of the first vertical thermal shielding layer and the second vertical thermal shielding layer includes $ReO_x$, $RuO_x$, $IrO_x$, ITO, a combination thereof, or an alloy or doping thereof (with or without other thermally conductive materials).

In some implementations, a thermal conductivity of the first vertical thermal shielding layer or the second vertical thermal shielding layer is lower than that of the lateral thermal shielding layer.

In some implementations, a thermal conductivity of the first vertical thermal shielding layer or the second vertical thermal shielding layer is lower than 50 W/m-k.

In some implementations, an electrical conductivity of the first vertical thermal shielding layer or the second vertical thermal shielding layer is higher than that of the lateral thermal shielding layer.

In some implementations, an electrical conductivity of the first vertical thermal shielding layer or the second vertical thermal shielding layer is lower than that of the top electrode and the bottom electrode.

In some implementations, an electrical conductivity of the first vertical thermal shielding layer or the second vertical thermal shielding layer is higher than $10^6$ S/m (Siemens per meter).

In some implementations, a material of the bottom electrode or the top electrode comprises Pt, Ti, TiN, Pd, Ir, W, Ta, Hf, Nb, V, Ru, TaN, NbN, a combination thereof, or an alloy or doping thereof (with or without other thermally conductive materials).

In some implementations, a material of the filament forming layer comprises $TaO_x$ (where x≤2.5), $HfO_x$ (where x≤2.0), $TiO_x$ (where x≤2.0), $ZrO_x$ (where x≤2.0), or a combination thereof.

In some implementations, the filament forming layer is configured to form a filament within the filament forming layer when a set voltage/current is applied on the filament forming layer.

In some implementations, a material of the filament includes Ta-rich, Hf-rich, Ti-rich or Zr-rich oxide material.

In some implementations, the apparatus further includes a lateral thermal shielding layer isolating the filament forming layer, the bottom electrode, and the top electrode, from the bottom wire and the top wire.

In some implementations, the lateral thermal shielding layer is formed on the substrate and encapsulates a sidewall of the filament forming layer, the first vertical thermal shielding layer, the second vertical thermal shielding layer, the bottom electrode, and the top electrode.

In some implementations, a material of the lateral thermal shielding layer includes $Al_2O_3$, $SiO_2$, SiN, MgO, $TiO_2$, AlOxNy, SiOxNy or a combination thereof.

In some implementations, a method includes: forming a bottom wire on a substrate; forming a first vertical thermal shielding layer on the bottom wire; forming a bottom electrode on the first vertical thermal shielding layer; forming a filament forming layer on the bottom electrode; forming a top electrode on the filament forming layer; forming a second vertical thermal shielding layer on the top electrode; and forming a top wire on the second thermal shielding layer, wherein a material of the first vertical thermal shielding layer and the second vertical thermal shielding layer comprises $ReO_x$, $RuO_x$, $IrO_x$, ITO, or any combination or alloy or doping other thermally conductive materials thereof.

In some implementations, the method further includes: forming a lateral thermal shielding layer covering a sidewall of the filament forming layer, the first vertical thermal shielding layer, the second vertical thermal shielding layer, the bottom electrode, and the top electrode.

BRIEF DESCRIPTION OF THE DRAWINGS

FIG. 2 is a table showing thermal conductivities and electrical conductivities of certain materials in some implementations of the present disclosure.

DETAILED DESCRIPTION

Technologies relating to providing thermal shield to RRAM cells in crossbar array circuits are disclosed. The technologies described in the present disclosure may provide the following technical advantages.

First, the disclosed technologies provide thermal shields within an analog switching RRAM-based crossbar array circuit. A thermal shield may preserve joule heating within a cell, providing a more uniformed temperature distribution within the cell and a more uniformed oxygen vacancy distribution during a switching process. These technologies may thus improve the linearity of analog RRAM cells.

Second, various designs of the thermal shields described in the present disclosure improve a cell's linearity during analog switching: the conductance of a filament within an RRAM cell is proportional to the cross sectional area of the filament (as the length of the filament is fixed by the distance between a bottom electrode and a matching top electrode) responsive to a voltage or current operation, while filament conductivity and oxygen vacancy mobility are temperature sensitive. Providing a thermal shield, therefore, reduces temperature variations of an RRAM cell during programming operation and thus reduces the variations in an RRAM cell's programming conductance.

Third, thick wires (for example, a row wire or a column wire) can conduct a large amount of heat away during a cell switching event, unintendedly behaving as a heat sink and causing temperature variations within a crossbar circuit. Providing thermal shields in a crossbar circuit prevents fast heat dissipation by thick wires.

Figure 1:
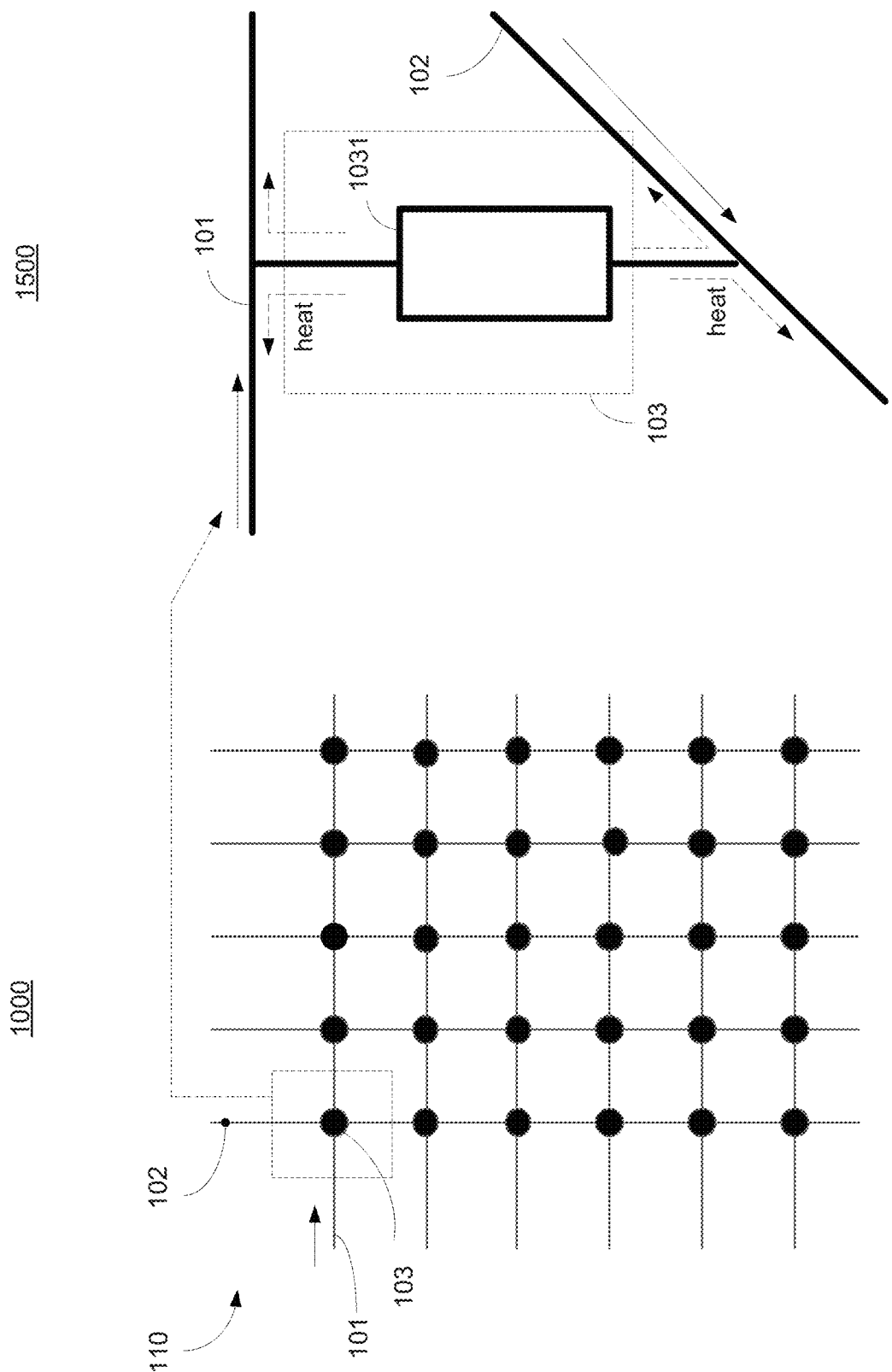
FIG. 1A is a block diagram illustrating an example crossbar array circuit in accordance with some implementations of the present disclosure.
FIG. 1B is a block diagram illustrating an example cross-point device in accordance with some implementations of the present disclosure.

FIG. 1A is a block diagram illustrating an example crossbar array circuit 100 in accordance with some implementations of the present disclosure. As shown in FIG. 1A, the crossbar array circuit 100 includes a first row wire 101, a first column wire 102, and a cross-point device 103.

FIG. 1B is a block diagram illustrating a partially enlarged view of the example cross-point device 103 in accordance with some implementations. As shown FIG. 1B, the cross-point device 103 connects the first row wire 101 and the first column wire 102 of the crossbar array circuit 100. In some implementations, the cross-point device 103 includes a RRAM cell 1031. In some implementations, the RRAM cell 1031 is one of: a one-transistor-one-memristor (1T1R) cell, one-selector-one-memristor (1S1R) cell, or a memristor (RRAM) cell.

In an RRAM crossbar array circuit, as shown in FIG. 1B for example, a RRAM cell 1031 is connected to a row wire (or a word line) 101 and a column wire (or a bit line) 102. Row wires and column wires are often thick metal wires, which provide greater electrical conductance and reduce the voltage drop across these wires. This is because if the space between wires is half pitch, the wire width is limited to the half pitch of a cell. To reduce voltage drops across the wires during an operation, the thickness of the wires might be increased. However, thick wires also conduct heat away during cell switching, effectively (although unintendedly) behaving as heat sinks. The heat dissipation from switching cells to these "heat sinks" may decrease the linearity of an analog RRAM, especially in the context of neuromorphic computing.

During analog RRAM operations, a filamentary cell is in the Low Resistance State (LRS) and thus has a conductance that is ideally proportional to the set current, which can be limited by a transistor (if the RRAM is part of a 1T1R cell) or other circuit components (if the RRAM is part of a 1S1R cell, or as a RRAM cell). Joule heat generated by the set current increases filament temperature, which in turn increases oxygen vacancy migration. Joule heat promotes oxygen migration during RRAM cell's switching and is a key factor on filamentary RRAM cells' fast switching speed. Therefore, reducing temperature variation during RRAM's cell switching with improved thermal shielding of an RRAM cell can reduce variations in filaments and produces a filament whose conductance is proportional to the set current.

A RRAM filament's conductance G is proportional to filament conductivity and filament cross sectional area, since the length of the filament remains constant in LRS. Filament conductivity and oxygen vacancy mobility are temperature dependent. If the switching temperature of a cell is manageable, the variations in filament conductivity and oxygen mobility at the switching temperature may also be manageable. Therefore, the conductance of a filament may be made proportional to the cross sectional area of the filament, improving the linearity of analog RRAMs Also, since the mobility of oxygen vacancy is temperature sensitive (varied exponentially with temperature), it is important to reduce joule heating variation by reducing RRAM cell's thermal variation during a cell switching event. Reducing heat dissipation within the switching cells may achieve a more uniform cell temperature distribution and a more uniform oxygen vacancy distribution, during analog switching events, thereby improving the linearity of analog switching. Shielding a cell thermally can therefore provide these technical advantages.

Thermally shielding a cell may include two processes: a lateral shielding process and a vertical shield process. The lateral thermal shielding is, in some implementations, implemented with Inter Layer Dielectric (ILD), for example, $SiO_2$, $Al_2O_3$, all of which have low thermal conductivities.

The vertical thermal shielding, in some implementations, is implemented with specific materials being placed between electrodes and wires; these materials are excellent electrical conductor, but poor heat conductor. In physics, the Wiedemann-Franz law dictates that the ratio of the thermal conductivity (K) to the electrical conductivity (a) of a metal is proportional to the temperature (T):

$$\frac{K}{\sigma} = LT,$$

where K represents the thermal conductivity, a represents the electrical conductivity, L represents the Lorenz number, and T represents the temperature.

The requirements on vertical thermal shielding materials (that a material be a good electrical conductor, but a poor heat conductor) excludes many metallic materials: metallic materials have both high electric conductivity and high thermal conductivities. Similarly deficient are most oxides: most oxides have both low electric conductivity (as an insulator or semiconductor) and low thermal conductivity. Special materials are therefore needed to provide this desirable characteristic—having high electrical conductivity, but low heat conductivity.

FIG. 2 is a table 200 showing thermal conductivities and electrical conductivities of certain materials in some implementations of the present disclosure.

Materials for Providing Lateral Thermal Shield

As shown in FIG. 2, $SiO_2$, $Si_3N_4$, and $Al_2O_3$ are ILD materials that have both low electrical conductivities and low thermal conductivities, rendering these materials suitable for providing lateral thermal shield.

Materials for Making Row Wires or Column Wires

As also shown in FIG. 2, W, Cu, and Al are common interconnect (between cells) materials that have both high electrical conductivities and high thermal conductivities, rendering these materials suitable for use as row wires and column wires.

Materials for Providing Vertical Thermal Shield

As further shown in FIG. 2, several conductive oxides, for instance, $ReO_3$, $RuO_2$, $IrO_2$, and ITO (indium-tin oxide, e.g., 90 wt % $In_2O_3$ and 10 wt % $SnO_2$) have higher electrical conductivities (compared to those of oxides) and lower thermal conductivities (compared to those of metals). These conductive oxides are generally used as electrodes in special applications, for instance ITO for optoelectronics due to its transparency, but not in other electrodes that do not require transparency, such as in RRAM devices.

For the purpose of providing vertical thermal shield to a RRAM device, however, the above-discussed conductive oxides (which have higher electrical conductivities and lower thermal conductivities) may improve linearity of analog switching. Additionally, the thermal conductivities of these conductive oxides may be further reduced by doping or alloying them with other materials that have low thermal conductivity. For these reasons, the above-discussed conductive oxides are suitable for providing vertical thermal shield to a RRAM cell.

Figure 3:
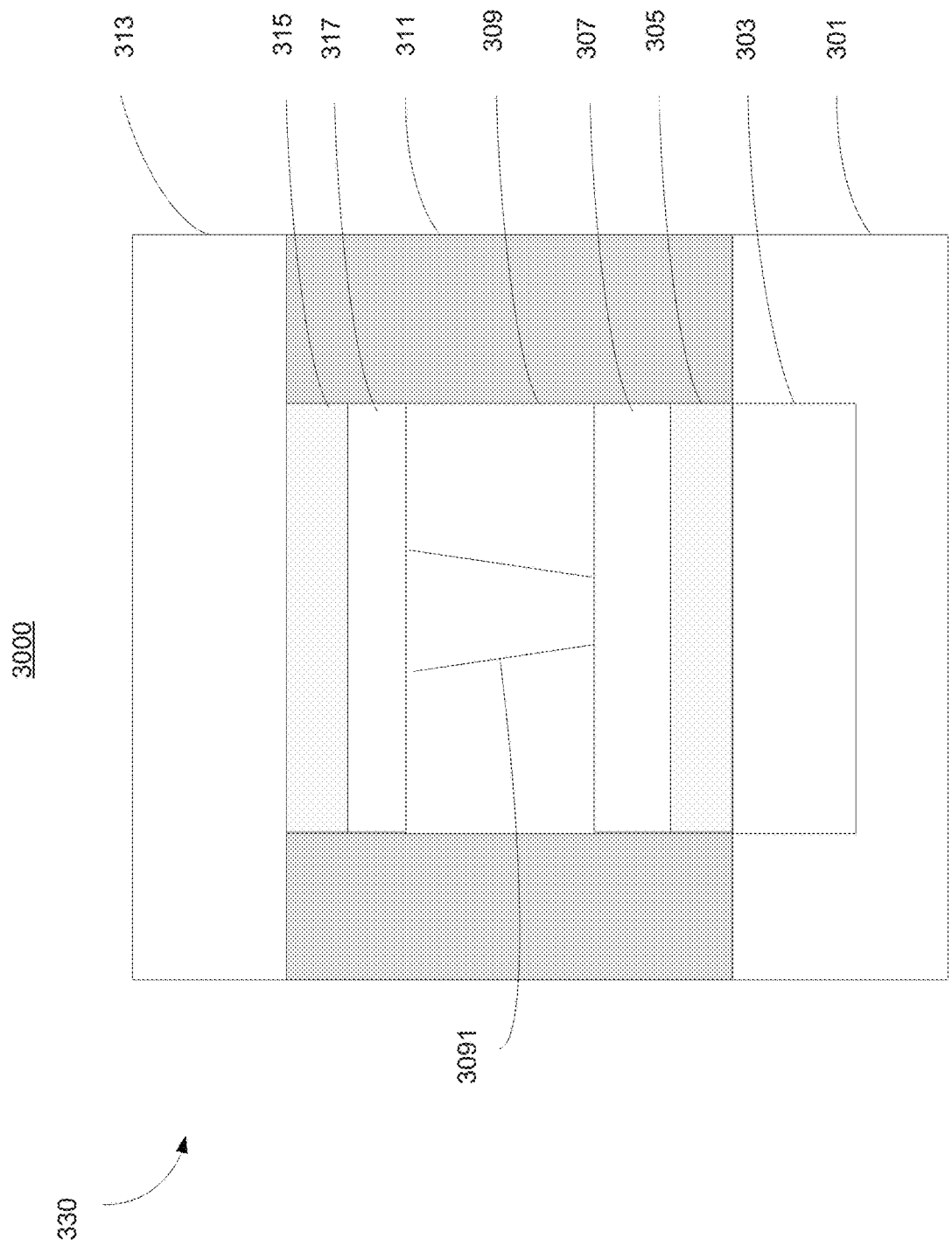
FIG. 3 is a block diagram illustrating an RRAM cell in accordance with some implementations of the present disclosure.

FIG. 3 is a block diagram illustrating an RRAM cell 300 in accordance with some implementations of the present disclosure.

As shown in FIG. 3, the RRAM cell 300 includes a substrate 301, a column wire (bottom wire) 303 formed on the substrate 301, a first vertical thermal shielding layer 305 formed on the column wire 303, a bottom electrode 307 formed on the first vertical thermal shielding layer 305, a filament forming layer 309 formed on the bottom electrode 307, a top electrode 317 formed on the filament forming layer 309, a second vertical thermal shielding layer 315 formed on the top electrode 317, a row wire (top wire) 313 formed on the second vertical shielding layer 315, and a lateral thermal shielding layer 311 isolating the filament forming layer 309, the bottom electrode 307, and the top electrode 317, from the column wire 303 and the row wire 313.

The substrate 301 is, in some implementations, made of one of the following materials: Si, SiN, $SiO_2$, $Al_2O_3$, or a combination thereof. The column wire 303 is, in some implementations, made of one of the following materials: Al, Au, Cu, Fe, Ni, Mo, Pt, Pd, Ti, TiN, TaN, W, a combination thereof, or an alloy or doping thereof (with or without other thermally conductive materials). The row wire 313 is, in some implementations, also made of one of the following materials: Al, Au, Cu, Fe, Ni, Mo, Pt, Pd, Ti, TiN, TaN, W, a combination thereof, or an alloy or doping thereof (with or without other thermally conductive materials).

The first vertical thermal shielding layer 305 is, in some implementations, made of one of the following materials: $ReO_x$, $RuO_x$, $IrO_x$, ITO, a combination thereof, or an alloy or doping thereof (with or without other thermally conductive materials). Similarly, the second vertical thermal shielding layer 315 is, in some implementations, made of one of the following materials: $ReO_x$, $RuO_x$, $IrO_x$, ITO, a combination thereof, or an alloy or doping thereof (with or without other thermally conductive materials).

The thermal conductivity of the first vertical thermal shielding layer 305 may be different from that of the lateral thermal shielding layer 311; the thermal conductivity of second vertical thermal shielding layer 315 may also be lower or higher than that of the lateral thermal shielding layer 311. In some implementations, the thermal conductivity of the first vertical thermal shielding layer 305 is lower than 50 W/m-k, or watts per meter per degree; in some implementations, the thermal conductivity of the second vertical thermal shielding layer 315 is also lower than 50 W/m-k or watts per meter per degree.

The electrical conductivity of the first vertical thermal shielding layer 305 may be higher than that of the lateral thermal shielding layer 311; the electrical conductivity of the second vertical thermal shielding layer 315 may also be higher than that of the lateral thermal shielding layer 311. In some implementations, the electrical conductivity of the first vertical thermal shielding layer 305 is lower than that of the top electrode 317 and that of the bottom electrode 307; the electrical conductivity of the second vertical thermal shielding layer 315 is also lower than that of the top electrode 317 and that of the bottom electrode 307. For example, the electrical conductivity of the first vertical thermal shielding layer 305 may be higher than $10^6$ S/m, or Siemens per meter; and the electrical conductivity of the second vertical thermal shielding layer 305 may also be higher than $10^6$ S/m, or Siemens per meter.

The bottom electrode 307 is, in some implementations, made of one of the following materials: Pt, Ti, TiN, Pd, Ir, W, Ta, Hf, Nb, V, TaN, NbN, a combination thereof, or an alloy or doping thereof (with or without other thermally conductive materials). The top electrode 317 is, in some implementations, made of one of the following materials: Pt, Ti, TiN, Pd, Ir, W, Ta, Hf, Nb, V, TaN, NbN, a combination thereof, or an alloy or doping thereof (with or without other thermally conductive materials). The bottom electrode 307 and the top electrode 317 may be configured to provide improved ohmic contact.

The filament forming layer 309 is, in some implementations, made of one of the following materials: $TaO_x$ (where x≤2.5), $HfO_x$ (where x≤2.0), $TiO_x$ (where x≤2.0), $ZrO_x$ (where x≤2.0), or a combination thereof. In some implementations, the filament forming layer 309 is configured to form a filament 3091, when a predetermined voltage or current is applied on the RRAM cell 300. The filament 3091 may be an oxygen vacancy rich filament. The filament 3091 is, in some implementations, made of one of the following materials: Ta-rich, Hf-rich, Ti-rich or Zr-rich oxide material.

The lateral thermal shielding layer 311 is, in some implementations, made of one of the following materials: $Al_2O_3$, $SiO_2$, SiN, MgO, $TiO_2$, AlOxNy, SiOxNy, or a combination thereof. As shown in FIG. 3, the lateral thermal shielding layer 311 may encapsulate the first vertical thermal shielding layer 305, the second vertical thermal shielding layer 315, the bottom electrode 307, the top electrode 317, and the filament forming layer 309. The lateral shielding wall (or the side wall) may effectively isolate, electrically, chemically and thermally, an RRAM cell and reduce temperature variation of the RRAM cell 300, both of which improve the analog linearity in an RRAM-based crossbar array circuit.

Temperature variation of the RRAM cell 300 is also reduced, because the first vertical thermal shielding layer 305 separates the column wire 303 (which may be seen as a heat sink) from the bottom electrode 307; and the second vertical thermal shielding layer 315 separates the row wire 313 (which may be seen as a heat sink) from the top electrode 317, reducing heat transfer among these components. The first vertical thermal shielding layer 305, the second vertical thermal shielding layer 315, and the lateral thermal shielding layer 311 structurally surround the filament forming layer 309 and thus reduce thermal variation with filament forming layer 309 during switching by preventing quick heat dissipation from the filament forming layer 309.

Figure 4:
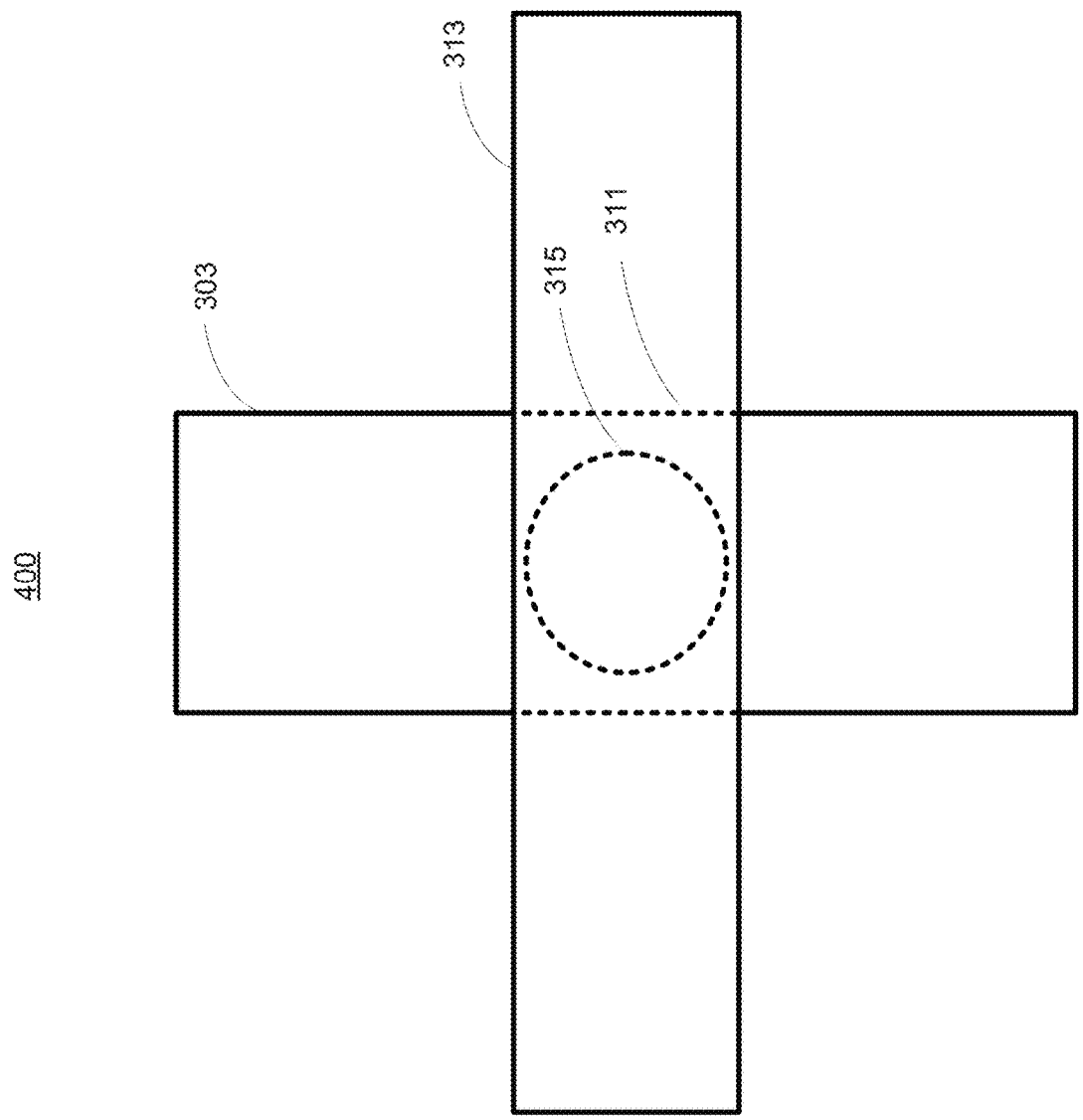
FIG. 4 is a block diagram illustrating a top view of a fabricated cross-point device in accordance with some implementations of the present disclosure.

FIG. 4 is a block diagram illustrating a top view 400 of a fabricated cross-point device in accordance with some implementations of the present disclosure.

As shown in FIG. 4, in some implementations, a RRAM cell may be of a cylinder shape in a top view. The first vertical thermal shielding layer 305, the second vertical thermal shielding layer 315, and the lateral thermal shielding layer 311 isolated the filament forming layer 309, the bottom electrode 307, and the top electrode 317, from the column wire 303 and the row wire 313.

Figure 5:
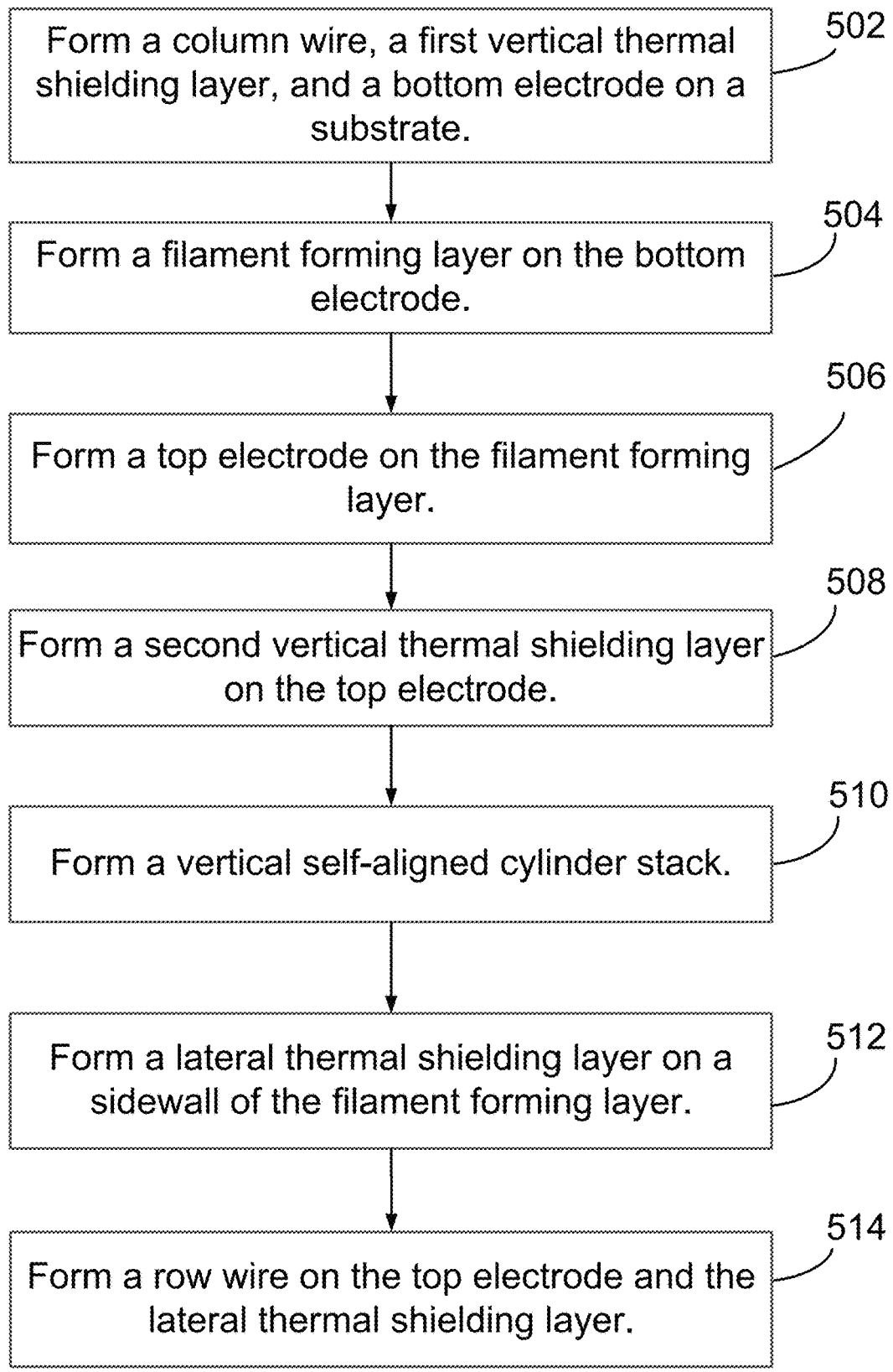
FIG. 5 is a flowchart illustrating an example method for fabricating a cross-point device in accordance with some implementations of the present disclosure.

FIG. 5 is a flowchart illustrating an example method 500 for fabricating a cross-point device in accordance with some implementations of the present disclosure.

As shown in FIG. 5, the method 500 may include providing the substrate 301 and forming the column wire (or the bottom wire) 303, the first vertical thermal shielding layer 305, and the bottom electrode 307 on the substrate 301 (step 502).

In some implementations, the method 500 may also include etching the substrate 301 with a ditch and deposit the column wire 303 on the substrate 301 and the ditch, as well as, using a Chemical Mechanical Polishing/Planarization (CMP) process to form the column wire 303.

Also, in some implementation, an interlayer (not shown) may be deposited on the substrate 301 and the column wire 303. And then, etch the interlayer (not shown) to the column wire 303 as a via, deposit the first vertical thermal shielding layer 305 and the bottom electrode 307 in the via on the column wire 303 and the interlayer (not shown), and CMP for surface planarization.

Next, the method 500 then includes forming the filament forming layer 309 on the bottom electrode 307 (step 504), forming the top electrode 317 on the filament forming layer 309 (step 506), and forming the second vertical thermal shielding layer 315 on the top electrode 317 (step 508). In some implementations, the filament forming layer 309 is formed by etching the filament forming layer 309 from the top of second vertical thermal shield layer 315 with a mask to form a vertical self-aligned cylinder stack (step 510) from the top of second vertical thermal shield layer 315 to the top of interlayer planarized with top of bottom electrode 307, or from the top of second vertical thermal shield layer 315 to the top of substrate planarized with top of bottom wire 303.

Next, the method 500 further includes forming a lateral thermal shielding layer 311 on the substrate 301 and encapsulating (or covering) a sidewall of the filament forming layer 309, the first vertical thermal shielding layer 305, the second vertical thermal shielding layer 315, the bottom electrode 307, and the top electrode 317 (step 512). In some implementations, method 500 additionally includes applying a CMP process for surface planarization upon the lateral thermal shielding layer 311 and the top of second vertical thermal shield layer 315. In some implementations, a passivation layer may be formed on a sidewall of the lateral thermal shielding layer 311 for better cell isolation.

The method 500 may additionally include forming the row wire (top wire) 313 on the top electrode 315 and the lateral thermal shielding layer 311 (step 514).

Plural instances may be provided for components, operations or structures described herein as a single instance. Finally, boundaries between various components, operations, and data stores are somewhat arbitrary, and particular operations are illustrated in the context of specific illustrative configurations. Other allocations of functionality are envisioned and may fall within the scope of the implementation(s). In general, structures and functionality presented as separate components in the example configurations may be implemented as a combined structure or component. Similarly, structures and functionality presented as a single component may be implemented as separate components. These and other variations, modifications, additions, and improvements fall within the scope of the implementation(s).

It will also be understood that, although the terms "first," "second," etc. may be used herein to describe various elements, these elements should not be limited by these terms. These terms are only used to distinguish one element from another. For example, a first column could be termed a second column, and, similarly, a second column could be termed the first column, without changing the meaning of the description, so long as all occurrences of the "first column" are renamed consistently and all occurrences of the "second column" are renamed consistently. The first column and the second are columns both column s, but they are not the same column.

The terminology used herein is for the purpose of describing particular implementations only and is not intended to be limiting of the claims. As used in the description of the implementations and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in accordance with a determination" or "in response to detecting," that a stated condition precedent is true, depending on the context. Similarly, the phrase "if it is determined (that a stated condition precedent is true)" or "if (a stated condition precedent is true)" or "when (a stated condition precedent is true)" may be construed to mean "upon determining" or "in response to determining" or "in accordance with a determination" or "upon detecting" or "in response to detecting" that the stated condition precedent is true, depending on the context.

The foregoing description included example systems, methods, techniques, instruction sequences, and computing machine program products that embody illustrative implementations. For purposes of explanation, numerous specific details were set forth in order to provide an understanding of various implementations of the inventive subject matter. It will be evident, however, to those skilled in the art that implementations of the inventive subject matter may be practiced without these specific details. In general, well-known instruction instances, protocols, structures, and techniques have not been shown in detail.

The foregoing description, for purpose of explanation, has been described with reference to specific implementations. However, the illustrative discussions above are not intended to be exhaustive or to limit the implementations to the precise forms disclosed. Many modifications and variations are possible in view of the above teachings. The implementations were chosen and described in order to best explain the principles and their practical applications, to thereby enable others skilled in the art to best utilize the implementations and various implementations with various modifications as are suited to the particular use contemplated.

What is claimed is:

1. An apparatus comprising:
   a bottom wire;
   a first vertical thermal shielding layer formed on the bottom wire;
   a bottom electrode formed on the first vertical thermal shielding layer;
   a filament forming layer formed on the first vertical thermal shielding layer;
   a top electrode formed on the filament forming layer;
   a second vertical thermal shielding layer formed on the top electrode;
   a top wire formed on the second vertical thermal shielding layer, wherein the filament forming layer is configured to form a filament within the filament forming layer when applying a switching voltage upon the filament forming layer, and wherein a material of the first vertical thermal shielding layer and the second vertical thermal shielding layer comprises $ReO_x$, $RuO_x$, $IrO_x$, ITO, a combination thereof, or an alloy or doping thereof.

2. The apparatus as claimed in claim 1, wherein a thermal conductivity of the first vertical thermal shielding layer or the second vertical thermal shielding layer is lower or higher than that of the lateral thermal shielding layer.

3. The apparatus as claimed in claim 1, wherein a thermal conductivity of the first vertical thermal shielding layer or the second vertical thermal shielding layer is lower than 50 W/m-k.

4. The apparatus as claimed in claim 1, wherein an electrical conductivity of the first vertical thermal shielding layer or the second vertical thermal shielding layer is higher than that of the lateral thermal shielding layer.

5. The apparatus as claimed in claim 1, wherein an electrical conductivity of the first vertical thermal shielding layer or the second vertical thermal shielding layer is lower than that of the top electrode and the bottom electrode.

6. The apparatus as claimed in claim 1, wherein an electrical conductivity of the first vertical thermal shielding layer or the second vertical thermal shielding layer is higher than $10^6$ S/m (Siemens per meter).

7. The apparatus as claimed in claim 1, wherein a material of the bottom electrode or the top electrode comprises Pt, Ti, TiN, Pd, Ir, W, Ta, Hf, Nb, V, TaN, NbN, or any combination or alloy of other electrically conductive materials thereof.

8. The apparatus as claimed in claim 1, wherein a material of the filament forming layer comprises $TaO_x$ (where x≤2.5), $HfO_x$ (where x≤2.0), $TiO_x$ (where x≤2.0), $ZrO_x$ (where x≤2.0) or a combination thereof.

9. The apparatus as claimed in claim 1, wherein the filament forming layer is configured to form a filament within the filament forming layer when a set voltage/current is applied on the filament forming layer.

10. The apparatus as claimed in claim 9, wherein a material of the filament comprises Ta-rich, Hf-rich, Ti-rich, or Zr-rich oxide material.

11. The apparatus as claimed in claim 1, further comprises a lateral thermal shielding layer isolating the filament forming layer, the bottom electrode, and the top electrode from the bottom wire and the top wire.

12. The apparatus as claimed in claim 11, wherein the lateral thermal shielding layer is formed on the substrate and encapsulates a sidewall of the filament forming layer, the first vertical thermal shielding layer, the second vertical thermal shielding layer, the bottom electrode, and the top electrode.

13. The apparatus as claimed in claim 11, wherein a material of the lateral thermal shielding layer comprises $Al_2O_3$, $SiO_2$, SiN, MgO, $TiO_2$, AlOxNy, SiOxNy or a combination thereof.

14. A method comprising:
    forming a bottom wire on a substrate;
    forming a first vertical thermal shielding layer on the bottom wire;
    forming a bottom electrode on the first vertical thermal shielding layer;
    forming a filament forming layer on the bottom electrode;
    forming a top electrode on the filament forming layer;
    forming a second vertical thermal shielding layer on the top electrode; and
    forming a top wire on the second thermal shielding layer, wherein a material of the first vertical thermal shielding layer and the second vertical thermal shielding layer comprises $ReO_x$, $RuO_x$, $IrO_x$, ITO, a combination thereof, or an alloy or doping thereof.

15. The method as claimed in claim 14, further comprising:
    forming a lateral thermal shielding layer covering a sidewall of the filament forming layer, the first vertical thermal shielding layer, the second vertical thermal shielding layer, the bottom electrode, and the top electrode.

* * * * *